United States Patent
Halliday et al.

(10) Patent No.: US 7,251,763 B2
(45) Date of Patent: Jul. 31, 2007

(54) BOUNDARY SCAN TESTING SYSTEM

(75) Inventors: David J. Halliday, West Leake (GB); Steven J. Lakin, Donisthorpe (GB)

(73) Assignee: Motorola, Inc., Schaumburg, IL (US)

(*) Notice: Subject to any disclaimer, the term of this patent is extended or adjusted under 35 U.S.C. 154(b) by 250 days.

(21) Appl. No.: 11/076,478

(22) Filed: Mar. 7, 2005

(65) Prior Publication Data
US 2006/0200718 A1 Sep. 7, 2006

(51) Int. Cl.
*G01R 31/28* (2006.01)
*G06F 13/00* (2006.01)
*G06F 11/00* (2006.01)

(52) U.S. Cl. .................. 714/727; 710/100; 714/43
(58) Field of Classification Search .................. 714/727
See application file for complete search history.

(56) References Cited

U.S. PATENT DOCUMENTS

| | | |
|---|---|---|
| 5,260,649 A | 11/1993 | Parker et al. |
| 5,864,659 A * | 1/1999 | Kini ............................ 714/31 |
| 6,578,167 B2 | 6/2003 | Boorom et al. |
| 6,845,410 B1 * | 1/2005 | Brown et al. .................. 710/29 |

FOREIGN PATENT DOCUMENTS

JP    2003262662 A  *  9/2003

OTHER PUBLICATIONS

IPMI Specification Second Generation v2.0 document revision 1.0 Feb. 12, 2004 Intel, Hewlett-Packard, NEC, Dell.*
"Unlocking the Power of Boundary-Scan", JTAG Technologies, http://www/jtag.com/main.
"1149.6 IEEE Standard for Boundary-Scan Testing of Advanced Digital Networks", IEEE Std 1149.6—2003, IEEE Computer Society, sponsored by the Test Technology Standards Committee, The Institute of Electrical and Electronics Engineers, Inc., New York, Apr. 17, 2003, Print: SH95084, PDF: SS95084, pp. i-132.
"IEEE Standard Test access Port and Boundary-Scan Architecture", IEEE Std 1149.1—2001, IEEE Computer Society, sponsored by the Test Technology Standards Committee, American National Standards Institute, The Institute of Eelctrical and Electronics Engineers, Inc. New York, 2001, pp. i-200.

* cited by examiner

*Primary Examiner*—Cynthia Britt

(57) ABSTRACT

A boundary scan testing system may include a baseboard (102, 202), a computing module (104, 204) coupled to the baseboard, and a boundary scan test module (106, 206, 306, 406) coupled to the computing module, where the boundary scan test module is coupled to execute a boundary scan test (120, 220, 320, 420) on the computing module via a set of boundary scan instructions (114, 214) received remotely over at least one of an IP network (110, 210) and an I$^2$C bus (211).

20 Claims, 3 Drawing Sheets

100, SYSTEM

200, SYSTEM

BOUNDARY SCAN TESTING SYSTEM

BACKGROUND OF INVENTION

Current boundary scan testing methods for printed circuit boards utilize vendor-specific hardware that uses software and files compiled to run on that particular hardware. This requires costly test stations that must be local to the unit under test (UUT) and specific connectivity cabling to connect the testing hardware to the UUT. The prior art also requires vendor-specific software to run and diagnose the test results. These often proprietary test stations can vary in configuration from vendor to vendor and are not interchangeable. The prior art has the disadvantage in that often proprietary and costly vendor specific hardware and software is required to run a boundary scan test. The prior art has the further disadvantage in that the test equipment must be situated locally to the UUT, as specific and unique cabling is required between the test hardware and the UUT.

There is a need, not met in the prior art, to perform boundary scan testing of integrated circuits without the need for costly vendor-specific and from locations other than locally to a UUT. Accordingly, there is a significant need for an apparatus and method that overcomes the deficiencies of the prior art outlined above.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent in light of certain exemplary embodiments recited in the Detailed Description, wherein:

Figure 1:
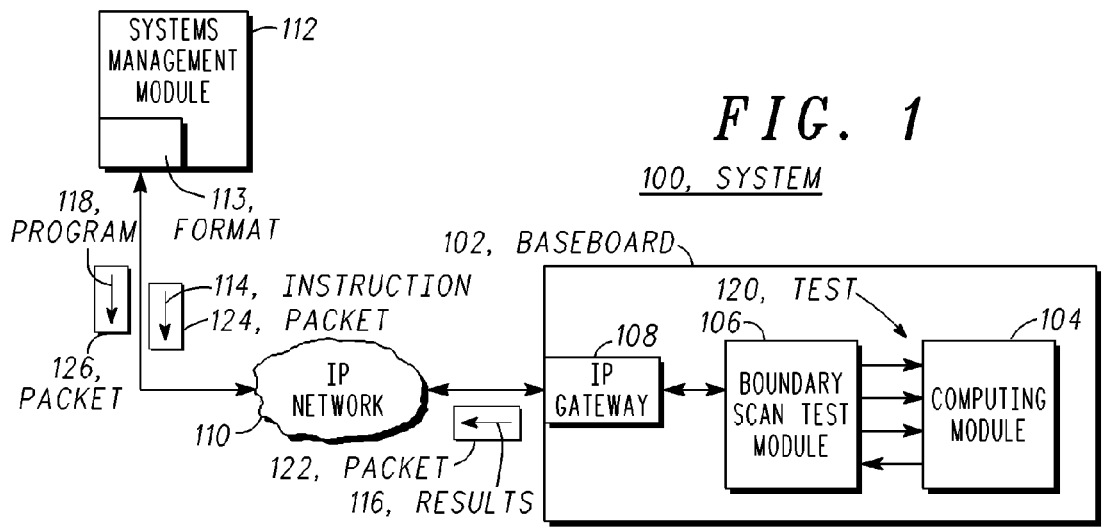
FIG. 1 representatively illustrates a boundary scan testing system in accordance with an exemplary embodiment of the present invention.

Elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms "first", "second", and the like herein, if any, are used inter alia for distinguishing between similar elements and not necessarily for describing a sequential or chronological order. Moreover, the terms "front", "back", "top", "bottom", "over", "under", and the like in the Description and/or in the Claims, if any, are generally employed for descriptive purposes and not necessarily for comprehensively describing exclusive relative position. Any of the preceding terms so used may be interchanged under appropriate circumstances such that various embodiments of the invention described herein may be capable of operation in other configurations and/or orientations than those explicitly illustrated or otherwise described.

DETAILED DESCRIPTION OF EXEMPLARY EMBODIMENTS

The following representative descriptions of the present invention generally relate to exemplary embodiments and the inventor's conception of the best mode, and are not intended to limit the applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention.

A detailed description of an exemplary application, namely a boundary scan testing system, is provided as a specific enabling disclosure that may be generalized to any application of the disclosed system, device and method for boundary scan testing in accordance with various embodiments of the present invention.

Boundary scan testing of integrated circuits (IC's) is defined in the IEEE standard 1149.1 (Test Access Port and Boundary-Scan Architecture) and IEEE standard 1149.6 (Boundary-Scan Testing of Advanced Digital Networks), which define a four-wire serial interface (a fifth wire is optional) designated the Test Access Port (TAP) to access ICs such as microprocessors, digital signal processors (DSPs), application specific integrated circuits (ASICs), programmable logic devices (PLDs), and the like. In addition to the TAP, an IC may also contain shift registers and a state machine to execute the boundary-scan functions. Data entering the chip on the Test Data In (TDI) pin is stored in the instruction register or in one of the data registers. Serial data leaves the chip on the Test Data Out (TDO) pin. The boundary-scan logic is clocked by the signal on Test Clock (TCK), and the Test Mode Select (TMS) signal drives the state of the TAP controller. Test Reset (TRST) is optional and serves as a hardware reset signal.

In an embodiment, multiple scan-compatible ICs may be serially interconnected on the PCB, forming one or more boundary-scan chains, each chain having its own TAP. Each scan chain provides electrical access from the serial TAP interface to every pin on every IC that is part of the chain. In normal operation, the IC performs its intended function as though the boundary-scan circuits were not present. However, when the device's scan logic is activated for the purpose of testing or in-system programming, data may be sent to the IC and read from it using the serial interface. This data may be used to stimulate the device core, drive signals outward from the device pins to the PCB, sense the input pins from the PCB and sense the device outputs.

FIG. 1 representatively illustrates a boundary scan testing system 100 in accordance with an exemplary embodiment of the present invention. In an embodiment, boundary scan testing system 100 comprises a baseboard 102, which can be a printed circuit board (PCB), and the like. Coupled to the baseboard 102 is a computing module 104, which can be a processor, DSP, ASIC, PLD, RAM, and the like. Computing module 104 can be any device that is capable of being tested using boundary scan testing techniques. Also coupled to baseboard 102 is boundary scan test module 106.

In an embodiment, baseboard 102 may include an IP gateway 108 allowing baseboard 102 to communicate with outside entities using IP network 110. In particular, baseboard 102 may communicate with systems management module 112 located remotely from baseboard 102 over IP network 110.

In an embodiment, systems management module 112 may be any combination of software modules, computer hardware, and the like, located remotely from computing module 104. In an exemplary embodiment, systems management module 112 may use a file transfer protocol (FTP) or Remote Management Control Protocol (RMCP) to communicate with baseboard 102 and boundary scan test module 106 remotely over IP network 110.

Internet Protocol (IP) is the world's most popular open-system (nonproprietary) protocol suite because it can be used to communicate across any set of interconnected networks and is equally well suited for LAN and WAN communications. IP packet network 110 can operate using a suite of communication protocols known in the art, of which the two best known are the Transmission Control Protocol (TCP) and the Internet Protocol (IP). The Internet protocol suite not only includes lower-layer protocols (such as TCP and IP), but also can specify common applications such as electronic mail, terminal emulation, and file transfer.

The Internet Protocol is a network-layer protocol that contains addressing information and some control information that enables packets to be routed. IP is the primary network-layer protocol in the Internet protocol suite. Along with the Transmission Control Protocol, IP represents the heart of the Internet protocols. IP has two primary responsibilities: providing connectionless, best-effort delivery of packets through an internetwork of nodes, and providing fragmentation and reassembly of packets to support data links with different maximum-transmission unit (MTU) sizes.

In an embodiment, boundary scan testing of computing module 104 may be initiated remotely from systems management module 112 over IP network 110. Boundary scan test module 106 on baseboard 102 may be coupled to execute a boundary scan test 120 on one or more computing modules 104 via a set of boundary scan instructions 114 received remotely over IP network 110. In an embodiment, boundary scan instructions 114 can comprise programming data, test vectors, and the like.

In an embodiment, boundary scan test module 106 can be any combination of hardware or software coupled to execute a boundary scan test 120 on computing module 104. For example, boundary scan test module 106 may include a programmable logic device, such as a field programmable gate array (FPGA) coupled with any number of software blocks to implement boundary scan test 120 on computing module 104. In another embodiment, boundary scan test module 106 may be an ASIC coupled to execute boundary scan test 120.

In one exemplary embodiment, a set of boundary scan instructions 114 may be initiated remotely from computing module 104, for example, at systems management module 112. In this example, boundary scan test programming necessary to implement the boundary scan test is substantially resident in boundary scan test module 106. Set of boundary scan instructions 114 may instruct the resident boundary test programming on boundary scan test module 106 to execute, thereby running boundary scan test 120 on computing module 104. In an embodiment, set of boundary scan instructions 114 may be initiated in a format compatible with the IEEE 1149.1 and/or IEEE 1149.6 standards, known in the art as Joint Test Action Group (JTAG). For example, set of boundary scan instructions 114 may be initiated in a JTAG compatible format 113 such as serial vector format (SVF), and the like.

In an embodiment, set of boundary scan instruction 114 may be converted to a binary format and/or compressed prior to encapsulating in at least one IP packet 124 for communicating over IP network 110 to baseboard 102. For example, set of boundary scan instructions 114 may be encapsulated in a data portion of at least one IP packet 124.

In an embodiment, at least one IP packet 124 may be communicated over IP network 110 to IP gateway 108 of baseboard 102. Boundary scan test module 106 may then de-capsulate set of boundary scan instructions 114 from at least one IP packet 124 and forward set of boundary scan instructions 114 to boundary scan test module 106. Utilizing set of boundary scan instructions 114, boundary scan test module 106 may then execute boundary scan test 120 on computing module 104 using a substantially resident boundary scan program.

In another embodiment, boundary scan test program 118 may be communicated to boundary scan test module 106 remotely over IP network 110. Boundary scan test program 118 may be all or part of the programming necessary to run a boundary scan test 120. In this embodiment, programming necessary to execute boundary scan test 120 is substantially not resident on boundary scan test module 106. In an embodiment, boundary scan test program 118 may be initiated in a format compatible with the IEEE 1149.1 and/or IEEE 1149.6 standards (JTAG). For example, boundary scan test program 118 may be initiated in a JTAG compatible format 113 such as serial vector format (SVF), and the like.

In an embodiment, boundary scan test program 118 may be converted to a binary format and/or compressed prior to encapsulating in at least one IP packet 126 for communicating over IP network 110 to baseboard 102. For example, boundary scan test program 118 may be encapsulated in a data portion of at least one IP packet 126.

In an embodiment, at least one IP packet 126 may be communicated over IP network 110 to IP gateway 108 of baseboard 102. Boundary scan test module 106 may then de-capsulate boundary scan test program 118 from at least one IP packet 126 and forward boundary scan test program 118 to boundary scan test module 106. Upon receiving set of boundary scan instructions 114, boundary scan test module 106 may then execute boundary scan test 120 on computing module 104 using boundary scan test program 118.

In an embodiment, after performing boundary scan test 120 on computing module 104, set of boundary scan test results 116 may then be created. In one embodiment, set of boundary scan test results 116 may be displayed locally, stored locally or transmitted to a remote location, for example system management module 112. In an embodiment, set of boundary scan test results 116 may be converted to a binary format, compressed and encapsulated in at least one IP packet 122 for transmission to systems management module 112 over IP network 110. Boundary scan test results 116 may be converted back to a JTAG compatible format, another format, and the like.

Figure 2:
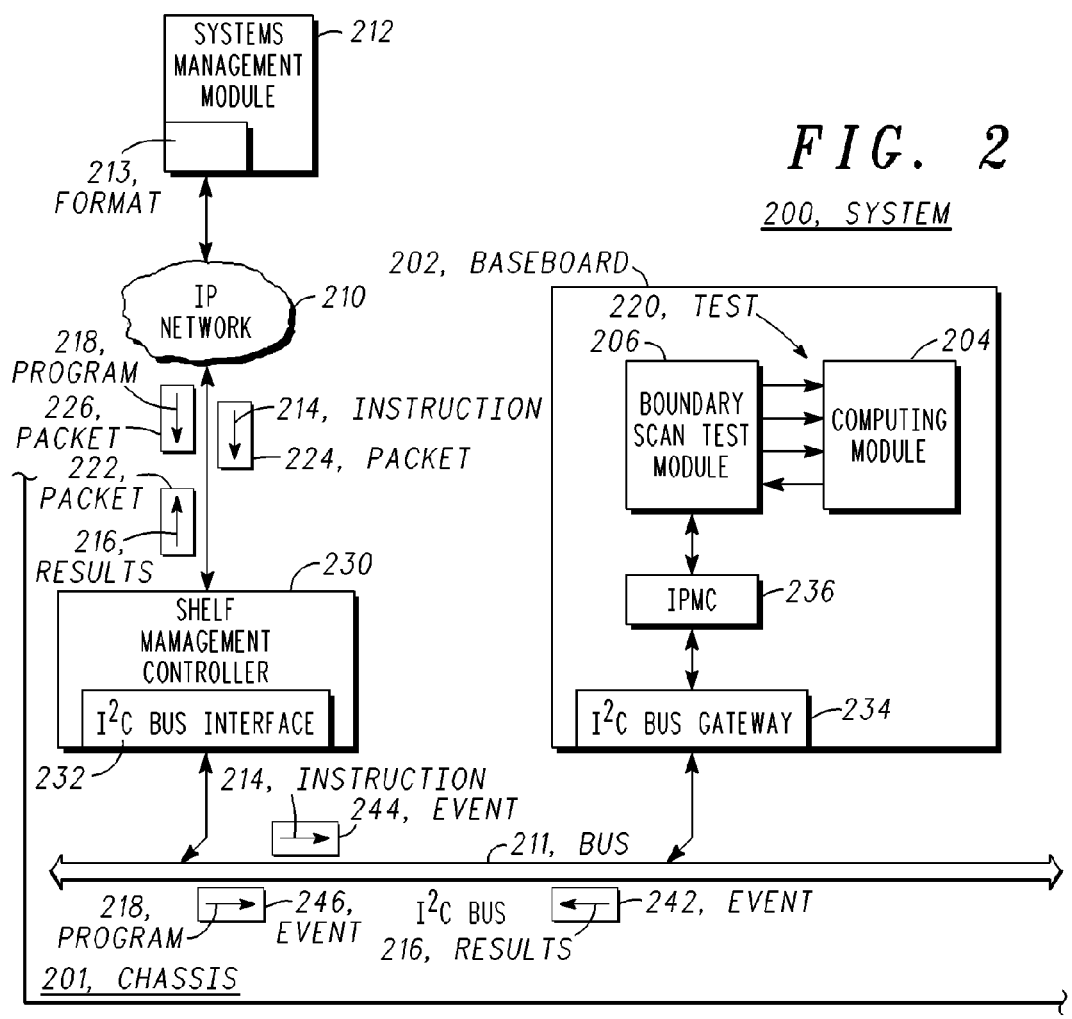
FIG. 2 representatively illustrates a boundary scan testing system in accordance with another exemplary embodiment of the present invention.

FIG. 2 representatively illustrates a boundary scan testing system 200 in accordance with another exemplary embodiment of the present invention. In an embodiment, boundary scan testing system 200 comprises a baseboard 202, which can be a printed circuit board (PCB), and the like. Coupled to the baseboard 202 is a computing module 204, which can be a processor, DSP, ASIC, PLD, RAM, and the like. Computing module 204 can be any device that is capable of being tested using boundary scan testing techniques. Also coupled to baseboard 202 is boundary scan test module 206.

In an embodiment, baseboard 202 may be coupled to interface with an embedded computer chassis 201. Embedded computer chassis 201 may support a point-to-point, switched input/output (I/O) fabric. Embedded computer chassis 201 may include both node-to-node (for example computer systems that support I/O node add-in slots) and chassis-to-chassis environments (for example interconnecting computers, external storage systems, external Local Area Network (LAN) and Wide Area Network (WAN) access devices in a data-center environment).

In an embodiment, embedded computer chassis 201 may be coupled to support any number of baseboards 202 having form factors coupled to support CompactPCI™, Compact-TCA™, AdvancedTCA™, and the like. In this embodiment baseboard 202 may be any card coupled to interface with a backplane configuration in an embedded computer chassis 201. This may include a payload card, switch card, rear transition card, and the like.

Embedded computer chassis 201 may be coupled to support a backplane environment. A backplane may accommodate any combination of a packet switched backplane including a distributed switched fabric or a multi-drop bus type backplane. In an embodiment, the backplane of embedded computer chassis 201 may include an Inter-Integrated Circuit ($I^2C$) bus 211. An $I^2C$ bus 211 includes 2 active wires and a ground connection. The active wires, called Serial Data line (SDA) and Serial Clock line (SCL), are both bi-directional. The $I^2C$ bus 211 is a multi-master bus, meaning that more than one device capable of initiating a data transfer can be connected to it. Every device coupled to the $I^2C$ bus has its own unique address. $I^2C$ bus compatible devices incorporate an on-board interface, allowing them to communicate with each other directly using the $I^2C$ bus 211. The $I^2C$ bus is defined in the $I^2C$ bus specification, version 2.1, January 2000, can be found at www.i2c-bus.org. In an embodiment, baseboard 202 may include an $I^2C$ bus gateway 234 allowing baseboard 202 to communicate with other boards in embedded computer chassis 201 using $I^2C$ bus 211.

In an embodiment, baseboard 202 may communicate with shelf management controller 230. In an embodiment, the shelf management controller 230 can function as a controller of the network operating on the backplane of embedded computer chassis 201. Shelf management controller 230 can be a separate card in embedded computer chassis 201 and include an $I^2C$ bus gateway 232 to communicate on $I^2C$ bus 211. In an embodiment, shelf management controller 230 can also interface with IP network 210. In this embodiment, shelf management controller 230 is coupled to function as a gateway for baseboard 202 to devices and systems external to embedded computer chassis 201, for example and without limitation, systems management module 212 located remotely from baseboard 202. In an embodiment, shelf management controller 230 is coupled to communicate with systems management module 212 over IP network 210.

In an embodiment, systems management module 212 may be any combination of software modules, computer hardware, and the like, located remotely from computing module embedded computer chassis 201. In an exemplary embodiment, systems management module 212 may use a file transfer protocol (FTP) to communicate with shelf management controller 230 and boundary scan test module 206 remotely over IP network 210.

In an embodiment, baseboard 202 may include an Intelligent Platform Management Controller (IPMC) 236 coupled to operate an Intelligent Platform Management Interface (IPMI), which operates to provide standardized records for describing platform management devices and their characteristics, for example and without limitation, temperature, voltage, and the like. IPMI is defined in the IPMI Interface Specification, version 2.0, Feb. 14, 2004 as published by Intel Corporation. IPMC 236 is coupled to $I^2C$ bus interface 234 and boundary scan test module 206 and coupled to process IPMI events. In an embodiment, IPMC 236 may be included in boundary scan test module 206.

In an embodiment, boundary scan testing of computing module 204 may be initiated remotely from systems management module 212 over IP network 210 and $I^2C$ bus 211. Boundary scan test module 206 on baseboard 202 may be coupled to execute a boundary scan test 220 on one or more computing modules 204 via a set of boundary scan instructions 214 received remotely over IP network 210 and $I^2C$ bus 211.

In an embodiment, boundary scan test module 206 can be any combination of hardware or software coupled to execute a boundary scan test 220 on computing module 204. For example, boundary scan test module 206 may include a programmable logic device, such as a field programmable gate array (FPGA) coupled with any number of software blocks to implement boundary scan test 220 on computing module 204. In another embodiment, boundary scan test module 206 may be an ASIC coupled to execute boundary scan test 220.

In one exemplary embodiment, a set of boundary scan instructions 214 may be initiated remotely from computing module 204, for example, at systems management module 212. In this example, boundary scan test programming necessary to implement the boundary scan test is substantially resident in boundary scan test module 206. Set of boundary scan instructions 214 may instruct the resident boundary test programming on boundary scan test module 206 to execute, thereby running boundary scan test 220 on computing module 204. In an embodiment, set of boundary scan instructions 214 may be initiated in a format compatible with the IEEE 1149.1 and/or IEEE 1149.6 standards (JTAG). For example, set of boundary scan instructions 214 may be initiated in a JTAG compatible format 213 such as serial vector format (SVF), and the like.

In an embodiment, set of boundary scan instruction 214 may be converted to a binary format and/or compressed prior to encapsulating an IPMI event. IPMI events are coupled to be recognized by IPMC 236 on baseboard 202. IPMI allows for customized extensions to be encapsulated in an IPMI event and passed by IPMC 236. Further, set of boundary scan instructions 214, already encapsulated in an IPMI event, may then be encapsulated in at least one IP packet 224 for communicating over IP network 210 to shelf management controller 230 using, for example, Remote Management Control Protocol (RMCP).

RMCP is a request-response protocol that can be delivered using UDP datagrams. RMCP includes a field that indicates the class of messages that can be embedded in an RMCP message packet, including a class for IPMI events.

In an embodiment, at least one IP packet 224 may be communicated over IP network 210 to shelf management controller 230 of embedded computer chassis 201. Shelf management controller 230 may then de-capsulate the IPMI event 244 having set of boundary scan instructions 214 from at least one IP packet 224 and forward IPMI event 244 having set of boundary scan instructions 214 to boundary scan test module 206 over $I^2C$ bus 211. In an embodiment, the $I^2C$ bus may be referred to as the Intelligent Platform Management Bus (IPMB). Boundary scan test module 206 may then de-capsulate set of boundary scan instructions 214 from IPMI event 244. Utilizing set of boundary scan instructions 214, boundary scan test module 206 may then execute boundary scan test 220 on computing module 204 using a substantially resident boundary scan program.

In another embodiment, boundary scan test program 218 may be communicated to boundary scan test module 206 remotely over IP network 210 and I²C bus 211. In an embodiment, boundary scan test program 218 may include part or all of the programming necessary to perform a boundary scan test 220 on computing module 204. In this embodiment, programming necessary to execute boundary scan test 220 is substantially not resident on boundary scan test module 206. In an embodiment, boundary scan test program 218 may be initiated in a format compatible with the IEEE 1149.1 and/or IEEE 1149.6 standards (JTAG). For example, boundary scan test program 218 may be initiated in a JTAG compatible format 213 such as serial vector format (SVF), and the like.

In an embodiment, boundary scan test program 218 may be converted to a binary format and/or compressed prior to encapsulating in an IPMI event 246. Subsequently, IPMI event 246 containing boundary scan test program 218 may then be encapsulated into at least one IP packet 226 for communicating over IP network 210 to shelf management controller 230. For example, IPMI event 246 having boundary scan test program 218 may be encapsulated in a data portion of at least one IP packet 226.

In an embodiment, at least one IP packet 226 may be communicated over IP network 210 to shelf management controller 230 of embedded computer chassis 201, which then may then de-capsulate IPMI event 246 having boundary scan test program 218 from at least one IP packet 226 and forward IPMI event 246 to boundary scan test module 206. Upon receiving set of IPMI event 246, boundary scan test module 206 may de-capsulate boundary scan test program 218. Subsequently, upon receiving boundary scan instructions 214, boundary scan test module 206 may then execute boundary scan test 220 on computing module 204 using boundary scan test program 218.

In an embodiment, after performing boundary scan test 220 on computing module 204, set of boundary scan test results 216 may then be created. In one embodiment, set of boundary scan test results 216 may be displayed locally, stored locally or transmitted to a remote location, for example system management module 212. In an embodiment, set of boundary scan test results 216 may be converted to a binary format, compressed and encapsulated in an IPMI event 242 and communicated over I²C bus 211 to shelf management controller 230. In an embodiment, IPMI event 242 may be encapsulated in at least one IP packet 222 for transmission to systems management module 212 over IP network 210. Boundary scan test results 216 may be converted back to a JTAG compatible format, another format, and the like.

Figure 3:
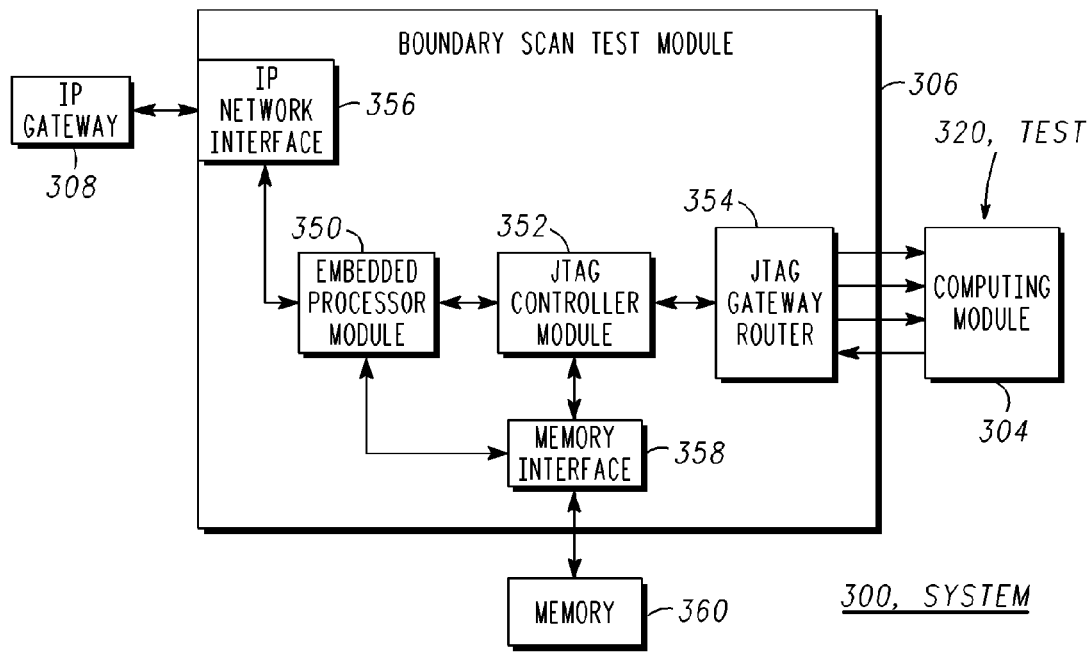
FIG. 3 representatively illustrates a boundary scan test module of a boundary scan testing system in accordance with an exemplary embodiment of the present invention.

FIG. 3 representatively illustrates a boundary scan test module 306 of a boundary scan testing system 300 in accordance with an exemplary embodiment of the present invention. In an embodiment, boundary scan test module 106 can be any combination of hardware or software coupled to execute a boundary scan test 320 on computing module 304 using a boundary scan test program. For example, boundary scan test module 306 may include a programmable logic device, such as a field programmable gate array (FPGA) coupled with any number of software blocks to implement boundary scan test 320 on computing module 304. In another embodiment, boundary scan test module 306 may be an ASIC coupled to execute boundary scan test 320.

In an embodiment, boundary scan test module 306 may include an IP network interface 356 coupled to communicate IP packets to and from IP gateway 308. Embedded processor module 350 can include a processor coupled to control translation between IP network interface 356 and JTAG controller module 352. Embedded processor module 350 may function to perform encapsulation/de-capsulation for transportation over the IP network, code compression/decompression, command interpretation, and the like. In an embodiment, embedded processor module 350 is coupled to execute boundary scan test program according to boundary scan instructions received remotely over IP network from systems management module.

In an embodiment, embedded processor module 350 is coupled to JTAG controller module 352. In an embodiment, JTAG controller module 352 is coupled to take the binary file received from systems management module and convert to a JTAG protocol per the JTAG specification IEEE 1149.1 and/or IEEE 1149.6. For example, JTAG controller module 352 can convert a JTAG compatible formatted file, for example an SVF file, to a JTAG protocol. In an embodiment, JTAG gateway router 354 is coupled to JTAG controller module 352 and is coupled to interface with computing module 304 using the standard 4 or 5 pin connection scheme for boundary scan testing as defined in IEEE 1149.1 and/or IEEE 1149.6. JTAG gateway router 354 can function to route commands for the boundary scan test 320 to computing module 304 and receive set of boundary scan test results.

In an embodiment, boundary scan test module 306 may include memory interface 358 to communicatively couple boundary scan test module 306 to memory 360 located external to boundary scan test module 306, for example, on baseboard. In another embodiment, boundary scan test module 306 may include memory as well. Memory 360 may function to store programs, instructions, results, and the like, for example boundary scan test program, set of boundary scan test instructions, set of boundary scan test results, and the like.

In one embodiment, IP network interface 356 may receive set of boundary scan instructions communicated remotely over IP network. Embedded processor module 350 may decompress the set of boundary scan instructions, while JTAG controller module 352 converts the set of boundary scan instructions to a JTAG protocol and executes boundary scan test 320. JTAG gateway router 354 routes the signals on the 4 or 5 pin cable assembly to execute the boundary scan test and receive the results. Set of boundary scan test results can be received by JTAG gateway router 354, communicated to JTAG controller module 352, where they are converted to a binary file and compressed in conjunction with embedded processor module 350. Set of boundary scan test results can be stored in memory 360 via memory interface and/or encapsulated in at least one IP packet and communicated to systems management module.

In an embodiment analogous with the above, boundary scan test module 306 may receive a set of fault insertion test instructions remotely over IP network. Set of fault insertion test instructions may be executed through embedded processor module 350 to program computing module 304 to execute fault insertion testing (this being the process of injecting specific faults into computing modules to test reaction to faults i.e. system hardening). In an embodiment, commands executed using a JTAG protocol may be used to program computing module 304 to execute a fault insertion test program to test computing module's response to fault.

In another embodiment analogous with the above, boundary scan test module 306 may receive a set of programming vectors remotely over IP network. Set of programming vectors may be executed through boundary scan test module 306 to program computing module 304. For example, commands executed using a JTAG protocol may be used to program computing module 304. An exemplary embodiment may be programming a memory device such as a FLASH memory device, and the like.

Figure 4:
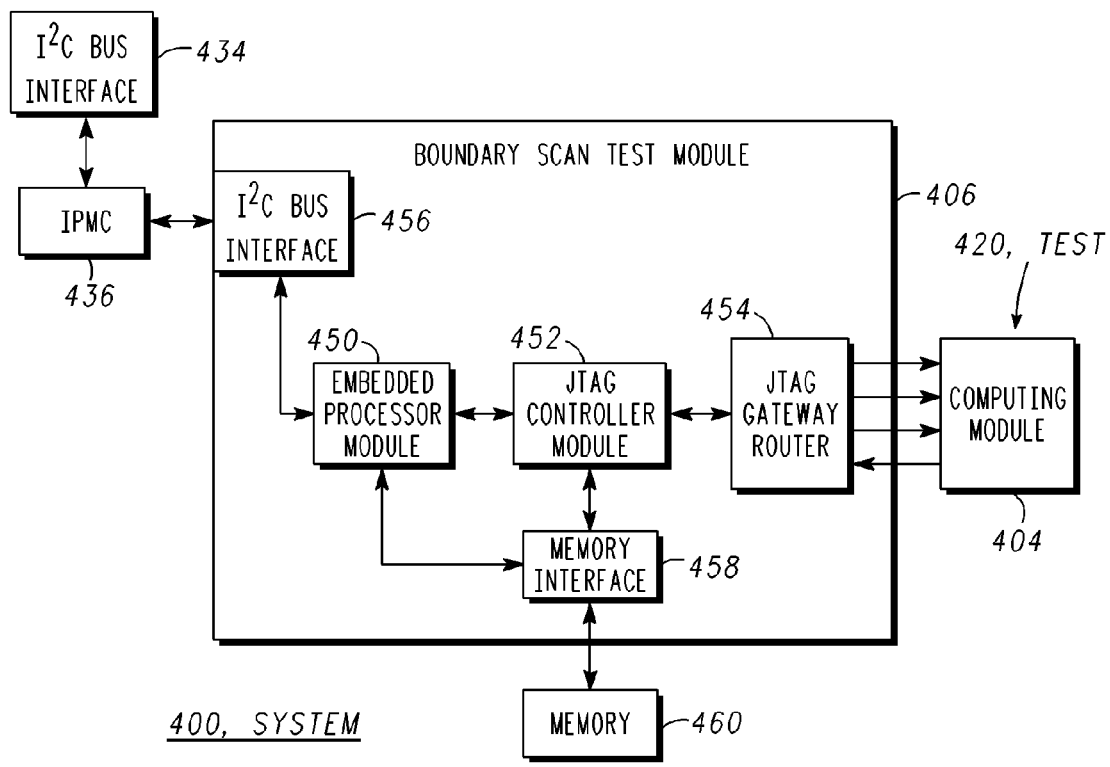
FIG. 4 representatively illustrates another boundary scan test module of a boundary scan testing system in accordance with an exemplary embodiment of the present invention.

FIG. 4 representatively illustrates another boundary scan test module 406 of a boundary scan testing system 400 in accordance with an exemplary embodiment of the present invention. In an embodiment, boundary scan test module 406 may include an I²C bus interface 456 coupled to communicate IPMI events to and from IPMC 436. Embedded processor module 450 can include a processor coupled to control translation between I²C bus interface 456 and JTAG controller module 452. Embedded processor module 450 may function to perform IPMI event encapsulation/decapsulation, code compression/decompression, command interpretation, and the like. In an embodiment, embedded processor module 450 is coupled to execute boundary scan test program according to boundary scan instructions received remotely over IP network from systems management module.

In an embodiment, embedded processor module 450 is coupled to JTAG controller module 452. In an embodiment, JTAG controller module 452 is coupled to take the binary file received from systems management module and convert to a JTAG protocol per the JTAG specification IEEE 1149.1 and/or IEEE 1149.6. For example, JTAG controller module 452 can convert a JTAG compatible formatted file, for example an SVF file, to a JTAG protocol. In an embodiment, JTAG gateway router 454 is coupled to JTAG controller module 452 and is coupled to interface with computing module 404 using the standard 4 or 5 pin connection scheme for boundary scan testing as defined in IEEE 1149.1 and/or IEEE 1149.6. JTAG gateway router 454 can function to route commands for the boundary scan test 420 to computing module 404 and receive set of boundary scan test results.

In one embodiment, I²C bus interface 456 may receive set of boundary scan instructions communicated remotely over IP network and I²C bus. Embedded processor module 450 may decompress the set of boundary scan instructions, while JTAG controller module 452 converts the set of boundary scan instructions to a JTAG protocol and executes boundary scan test 420. JTAG gateway router 454 routes the signals on the 4 or 5 pin cable assembly to execute the boundary scan test and receive the results. Set of boundary scan test results can be received by JTAG gateway router 454, communicated to JTAG controller module 452, where they are converted to a binary file and compressed in conjunction with embedded processor module 450. Set of boundary scan test results can be stored in memory 460 via memory interface and/or encapsulated in at least one IPMI event and communicated to shelf management module. Shelf management module may then encapsulate boundary scan test results in at least one IP packet and forward to systems management controller.

In an embodiment analogous with the above, boundary scan test module 406 may receive a set of fault insertion test instructions remotely over I²C bus. Set of fault insertion test instructions may be executed through embedded processor module 450 to program computing module 404 to execute fault insertion testing (this being the process of injecting specific faults into computing modules to test reaction to faults i.e. system hardening). In an embodiment, commands executed using a JTAG protocol may be used to program computing module 404 to execute a fault test program to test computing module's response to fault.

In another embodiment analogous with the above, boundary scan test module 406 may receive a set of programming vectors remotely over I²C bus. Set of programming vectors may be executed through boundary scan test module 406 to program computing module 404. For example, commands executed using a JTAG protocol may be used to program computing module 404. An exemplary embodiment may be programming a memory device such as a FLASH memory device, and the like.

Figure 5:
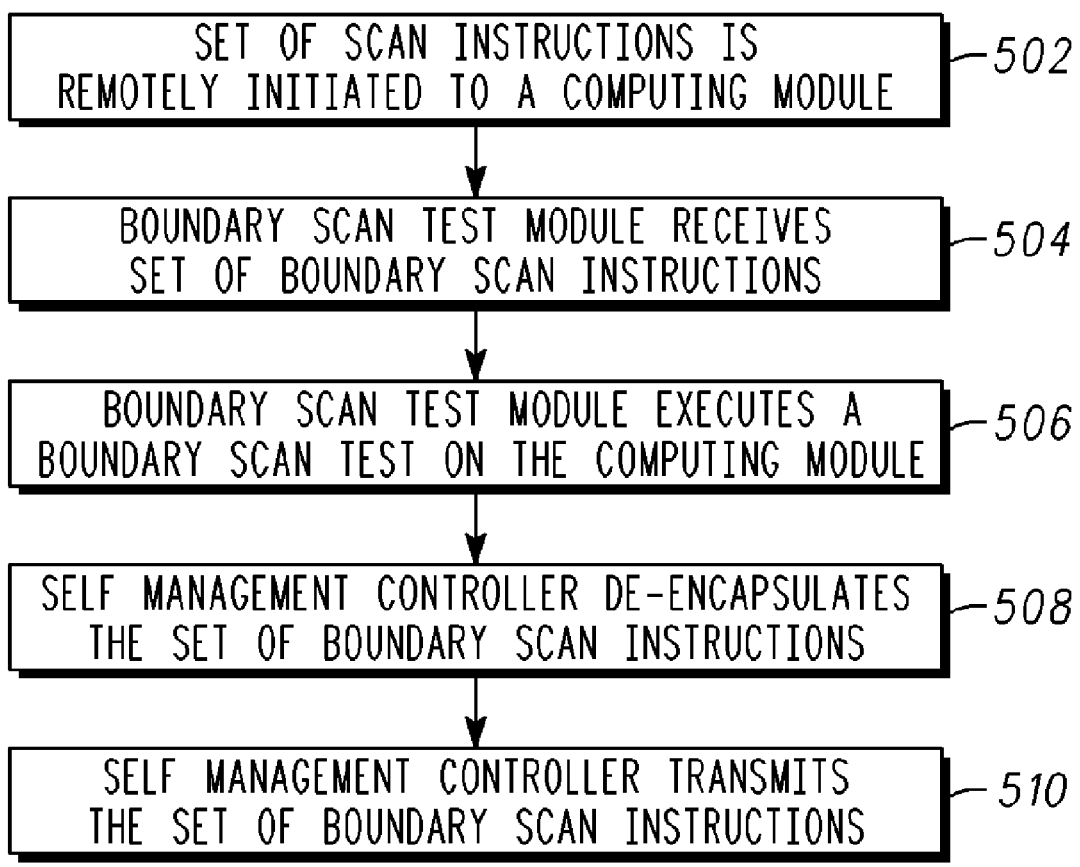
FIG. 5 representatively illustrates a flow chart for a method of a boundary scan testing system.

FIG. 5 representatively illustrates a flow chart 500 for a method of remotely performing a boundary scan test on a computer module. The method begins when a set of boundary scan instructions is remotely initiated 502 to a computing module over at least one of an IP network and an I²C bus. The boundary scan test module is coupled to the computing module, and the boundary scan test module receives 504 the set of boundary scan instructions communicated remotely via at least one of the IP network and the I²C bus. Then, the boundary scan test module executes 506 a boundary scan test on the computing module per the set of boundary scan instructions received remotely over at least one of an IP network and an I²C bus. In addition, a shelf management controller de-encapsulates 508 the set of boundary scan instructions from an IP packet. The shelf management controller also transmits 510 the set of boundary scan instructions encapsulated in an IPMI event to the boundary scan test module.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above.

For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

We claim:

1. A boundary scan testing system, comprising:
   a baseboard;
   a computing module coupled to the baseboard; and
   a boundary scan test module coupled to the computing module, wherein the boundary scan test module is coupled to execute a boundary scan test on the computing module via a set of boundary scan instructions received remotely over at least one of an IP network and an I$^2$C bus, and
   wherein the computer module is coupled to receive a set of fault insertion test instructions remotely over at least one of the IP network and the I$^2$C bus, wherein the set of fault test insertion instructions are initiated remotely in a JTAG compatible format, and wherein the set of fault test insertion instructions are coupled to program the computing module to execute a fault insertion test.

2. The boundary scan testing system of claim 1, wherein a boundary scan test program is communicated to the boundary scan test module remotely over at least one of the IP network and the I$^2$C bus, and wherein the boundary scan test program is coupled to execute via the set of boundary scan instructions received remotely over at least one of the IP network and the I$^2$C bus.

3. The boundary scan testing system of claim 1, wherein the set of boundary scan instructions is encapsulated in at least one IPMI event.

4. The boundary scan testing system of claim 1, wherein the set of boundary scan instructions is encapsulated in at least one IP packet.

5. The boundary scan testing system of claim 1, wherein at least one of the set of boundary scan instructions and a boundary scan test program are initiated remotely in a JTAG compatible format.

6. The boundary scan testing system of claim 1, wherein the computing module is coupled to be programmed by a set of programming vectors initiated remotely in a JTAG compatible format and communicated remotely over at least one of the IP network and the I$^2$C bus.

7. The boundary scan testing system of claim 1, wherein the boundary scan test module generates a set of boundary scan test results, and wherein the boundary scan test module communicates the set of boundary scan test results to a remote system management module over at least one of the IP network and the I$^2$C bus.

8. A method of remotely performing a boundary scan test on a computer module, comprising:
   remotely initiating a set of boundary scan instructions to a computing module over at least one of an IP network and an I$^2$C bus;
   a boundary scan test module coupled to the computing module receiving the set of boundary scan instructions communicated remotely via at least one of the IP network and the I$^2$C bus;
   the boundary scan test module executing a boundary scan test on the computing module per the set of boundary scan instructions received remotely over at least one of an IP network and an I$^2$C bus;
   a shelf management controller de-encapsulating the set of boundary scan instructions from an IP packet; and
   the shelf management controller transmitting the set of boundary scan instructions encapsulated in an IPMI event to the boundary scan test module.

9. The method of claim 8, wherein the computing module is coupled to a baseboard, and wherein the baseboard is coupled to interface with an embedded computer chassis.

10. The method of claim 8, further comprising:
    remotely communicating a boundary scan test program over at least one of the IP network and the I$^2$C bus to the boundary scan test module; and
    executing the boundary scan test program via the set of boundary scan instructions received remotely over at least one of the IP network and the I$^2$C bus.

11. The method of claim 8, wherein remotely initiating comprises encapsulating the set of boundary scan instructions in at least one IPMI event.

12. The method of claim 8, wherein remotely initiating comprises encapsulating the set of boundary scan instructions in at least one IP packet.

13. The method of claim 8, wherein remotely initiating comprises remotely initiating the set of boundary scan instructions in a JTAG compatible format.

14. The method of claim 8, further comprising:
    the boundary scan test module generating a set of boundary scan test results; and
    the boundary scan test module communicating the set of boundary scan test results to a remote systems management module over at least one of the IP network and the I$^2$C bus.

15. A boundary scan testing system comprising:
    a baseboard;
    a computing module coupled to the baseboard;
    a boundary scan test module coupled to the computing module, wherein the boundary scan test module is coupled to execute a boundary scan test on the computing module via a set of boundary scan instructions received remotely over at least one of an IP network and an I$^2$C bus, and
    a shelf management controller, wherein at least one of the set of boundary scan instructions and a boundary scan test program are de-encapsulated from an IP packet and transmitted in an IPMI event to the boundary scan test module.

16. The boundary scan testing system of claim 15, wherein a boundary scan test program is communicated to the boundary scan test module remotely over at least one of the IP network and the I$^2$C bus, and wherein the boundary scan test program is coupled to execute via the set of boundary scan instructions received remotely over at least one of the IP network and the I$^2$C bus.

17. The boundary scan testing system of claim 15, wherein the set of boundary scan instructions is encapsulated in at least one IPMI event.

18. The boundary scan testing system of claim 15, wherein the set of boundary scan instructions is encapsulated in at least one IP packet.

19. The boundary scan testing system of claim 15, wherein at least one of the set of boundary scan instructions and a boundary scan test program are initiated remotely in a JTAG compatible format.

20. The boundary scan testing system of claim 15, wherein the boundary scan test module generates a set of boundary scan test results, and wherein the boundary scan test module communicates the set of boundary scan test results to a remote system management module over at least one of the IP network and the I$^2$C bus.

* * * * *